US007571086B2

(12) United States Patent
Chang et al.

(10) Patent No.: US 7,571,086 B2
(45) Date of Patent: Aug. 4, 2009

(54) INCREMENTAL CIRCUIT RE-SIMULATION SYSTEM

(75) Inventors: Ying-Tsai Chang, Fremont, CA (US); Tayung Liu, Sunnyvale, CA (US); Yu-Chin Hsu, Cupertino, CA (US)

(73) Assignee: Springsoft USA, Inc., San Jose, CA (US)

( * ) Notice: Subject to any disclaimer, the term of this patent is extended or adjusted under 35 U.S.C. 154(b) by 248 days.

(21) Appl. No.: 11/267,726

(22) Filed: Nov. 4, 2005

(65) Prior Publication Data

US 2007/0106488 A1 May 10, 2007

(51) Int. Cl.
*G06F 17/50* (2006.01)

(52) U.S. Cl. .......................................... 703/14; 703/15

(58) Field of Classification Search .................... 703/14, 703/15, 16, 17; 716/4
See application file for complete search history.

(56) References Cited

U.S. PATENT DOCUMENTS

| | | | | |
|---|---|---|---|---|
| 5,838,947 | A * | 11/1998 | Sarin ........................... | 703/14 |
| 6,321,363 | B1 | 11/2001 | Huang et al. | |
| 6,389,379 | B1 * | 5/2002 | Lin et al. ...................... | 703/14 |
| 7,379,855 | B1 * | 5/2008 | Oda et al. ..................... | 703/14 |
| 2002/0133325 | A1 * | 9/2002 | Hoare et al. .................. | 703/17 |
| 2002/0152060 | A1 * | 10/2002 | Tseng ........................ | 703/17 |

OTHER PUBLICATIONS

IEEE Standard VHDL Language Reference Manual, IEEE Std 1076, 2000 Edition, OPAC Link: http://ieeexplore.ieee.org/servlet/opac?punumber=7180.*
Intusoft, 1988-1996, IsSPICE4 User's Guide, pp. 1-418.*

* cited by examiner

*Primary Examiner*—Paul L Rodriguez
*Assistant Examiner*—Eunhee Kim
(74) *Attorney, Agent, or Firm*—Smith-Hill & Bedell, P.C.

(57) ABSTRACT

A netlist description of a circuit is processed to classify some signals of the circuit as essential signals and to classify all other signals of the circuit as non-essential signals. Thereafter when simulating behavior of the entire circuit in response to input signals supplied over some time interval, a simulator saves first simulation data representing behavior of the circuit's essential signals during the time interval. Thereafter the simulator is programmed to re-simulate behavior of only a selected subcircuit of the circuit during only a selected subinterval of the full time interval based on behavior of essential signals described by the first simulation data. During the re-simulation, the simulator saves second simulation data representing behavior of both essential and non-essential signals of the subcircuit to provide a more complete picture of the behavior of the selected subcircuit during the selected subinterval. Before the initial full-circuit simulation, each signal is classified as an essential signal when its behavior during the full-circuit simulation must be represented by the first simulation data in order to provide sufficient information to program the simulator to re-simulate the behavior any selected subcircuit during any selected subinterval. All other circuit signals are classified as non-essential signals whose behavior need not be represented by the saved first simulation data.

14 Claims, 4 Drawing Sheets

INCREMENTAL CIRCUIT RE-SIMULATION SYSTEM

BACKGROUND OF THE INVENTION

1. Field of the Invention

The invention relates in general to circuit simulation and in particular to a method for re-simulating a selected portion of a circuit during a selected subinterval of the simulation time of a previous simulation of the entire circuit.

2. Description of Related Art

A digital circuit designer initially uses a high level language to model the logic to be carried out by an integrated circuit. Using various computer-aided design tools, the designer converts the high level language (HDL) description of the circuit into progressively lower level designs, until the circuit design is sufficiently detailed to guide IC fabrication. At each step of the process, the designer can use a computer-based circuit simulator to test the circuit design by programming the simulator with an input "testbench" derived from a netlist description of the circuit design and a description of the time-varying behavior of the circuit's input signals. A netlist can describe the circuit as being formed by instances of standard cells such as transistors, gates and passive devices communicating through signals conveyed by conductors ("nets") interconnecting the cell instances. A cell library provides detailed behavioral models of the standard cells the simulator can use to evaluate behavior of cell instances. As the design progresses to the layout stage, where cell instance positions and net routes are established, the simulator evaluates models of the nets to accurately account for path delays in the nets.

A simulator treats time as an independent variable. To carry out a simulation, the simulator must therefore remember the state of every signal it computes during each simulation time at least long enough to compute the state of each signal during the next simulation time. However, to enable a designer to determine how various circuit signals behaved during the simulation, a simulator must generate and save simulation data indicating times at which those signals change state and the state to which they change. Since the amount of simulation data a computer-based simulator generates during a simulation is usually much too large to retain in a computer's random access memory, a simulator will temporarily halt its simulation from time-to-time and perform a simulation data "dump" by writing the simulation data it has accumulated in memory to a hard disk or other bulk storage device. Since hard disk accesses require substantial amounts of time, the time a simulator needs to dump the simulation data to a hard disk often constitutes a substantial portion of the total amount of time it needs to perform a simulation.

A designer can reduce simulator processing time by reducing the amount of data the simulator must save to a hard disk during the simulation. One way to do that is program a simulator to initially simulate a circuit with no simulation data dump but to internally monitor simulation results and to report any detected failures or errors. When an error is reported, the designer can then program the simulator to re-simulate the entire full simulation data dump to enable the designer to debug the circuit. The main drawback to this approach is the slow turnaround time for the second simulation since the simulation must restart from the beginning of the full simulation interval.

Figure 1:
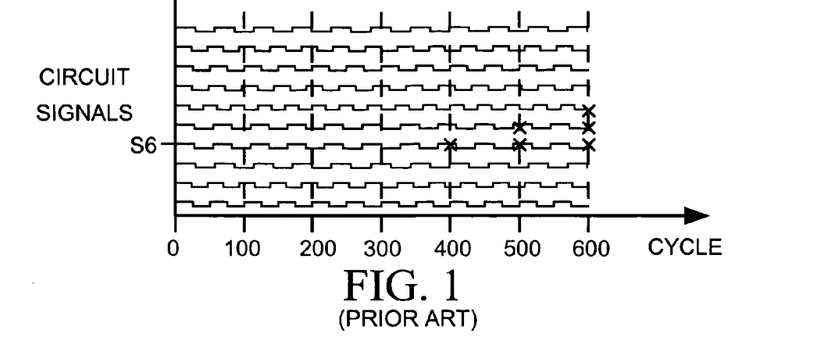
FIG. 1 is a timing diagram illustrating behavior of signals of a simulated circuit and indicating simulation times at which a circuit simulator using a prior art checkpoint system saves simulation data representing the current state of the simulator.

In a prior art "checkpoint" approach to simulation, a simulator saves "checkpoint data" only after every J nanoseconds of simulation time representing a "snapshot" of the current state of every signal at that simulation time, as well as other data needed to fully describe the state of the simulator at that simulation time, and refrains from saving a complete record of every signal state change. FIG. 1 is a timing diagram illustrating circuit signal states as functions of time. Vertical dashed lines indicate times for which the simulator saves snapshot data indicating signal states, where in this example, J=100. The snapshot data indicates an error, designated by an "x", occurred in signal S6 at times 400, 500 and 600 and in other signals at times 500 and 600. Since the amount of data needed to represent the state of the simulator and every signal after every 100 nanoseconds of simulation time can be much smaller that the amount of simulation data describing all signal state changes, the simulator need not write checkpoint data to the hard disk as often, and the simulation can progress more quickly.

Figure 2:
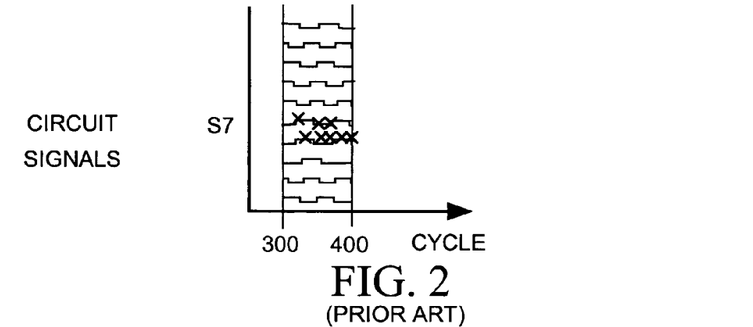
FIG. 2 is a timing diagram illustrating behavior of signals of the simulated circuit during a selected interval of simulation time when a circuit simulator using a prior art checkpoint system re-simulates the circuit.

Since errors tend to propagate from one signal to another in a circuit, an error that occurs between checkpoints is likely to cause an error in one or more signals at the next checkpoint. For example, the true source of the error in the state of signal S6 observed at simulation time 400 may be an error in setting the state of some other signal at an earlier time that affected the state of signal S6 at time 400. When the simulator provides the designer with snapshot data only for times 300 and 400, the designer will not be able to directly determine whether any signal errors occurred between times 300 and 400. However, the designer can program the simulator to re-simulate the entire circuit between times 300 and 400 as illustrated in FIG. 2, with the simulator providing data completely describing behavior of every signal between times 300 and 400 so that the simulator maintains a complete record of all signal behavior during that time, rather than just a snapshot of signal states acquired at selected checkpoints. As shown in FIG. 2 the designer can then see from the complete data record that errors begin to occur, for example, at time 325 with an error in a signal S7. The designer might then investigate the possibility of an error in logic or timing of the portion of the circuit producing signal S7 at time 325.

The simulator need not repeat the simulation from time 0 because the snapshot data it saved at time 300 fully describes the state of the circuit at that time, allowing the designer to program the simulator to initialize the circuit to that state when it carries out the re-simulation starting at time 300.

The checkpoint approach can reduce simulator processing time, but periodically saving snapshot data indicating states of all signals of a circuit during the simulation even for every Nth nanosecond can still be time-consuming. Re-simulation can start only from one of a set of pre-selected simulation times at which snapshot data rather from any desired simulation time. Limiting the number of checkpoints to reduce simulation time can substantially increase re-simulation processing time.

Figure 3:
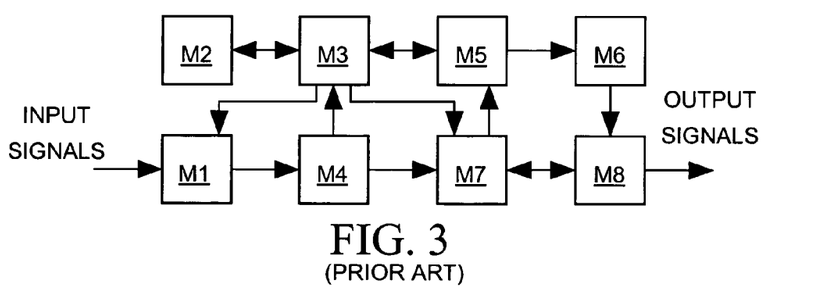
FIG. 3 is a block diagram illustrating modules of a prior art circuit and the signals they transmit and receive.

A netlist typically organizes a circuit design into hierarchy of modules that communicate with one another through signals that cross module boundaries, wherein each module residing at any level of the design is formed by a collection of cells and/or modules residing at a lower level of the design. For example FIG. 3 depicts a circuit design at a hierarchical level including eight modules M1-M8 communicating with one another through signals. U.S. Pat. No. 6,321,363 issued Jan. 11, 1999 to Huang teaches to reduce simulation interval by saving data only for the signals that pass between modules at a selected level of the design hierarchy while refraining from saving simulation data for signals that are wholly internal to a single module. Since a typical module will have a much larger number of internal signals than input and output signals, a simulator can substantially reduce processing time by saving simulation data only for module input and output signals. When, for example, a designer determines from the saved simulation data that an error in an output signal of module M3 occurred at some particular time, but that all of that module's input signals were correct up to that time, the designer will suspect that there is an error in the design of module M3. To obtain a more detailed view of the internal behavior of module M3, the designer can reprogram the simulator to re-simulate the behavior of only that module up to the time at which the module output signal error is detected, with the simulator saving simulation data for all of that module's signals, including not only its input and output signals but also its internal signals. In creating a testbench for programming the simulator to simulate only module M3, the designer can derive a description of the time-varying behavior of the signals that particular module receives from other modules M2, M4 and M5 from the simulation data the simulator saved during the initial full-circuit simulation.

When circuit includes devices such as RAMs, ROMs, latches, registers, flip-flops and the like for storing data and thereafter producing output signals representing the stored data, the response of a module to its input signals at any time during a simulation depends not only on its internal architecture, but also on the state of the data it currently stores in such memories. To reduce re-simulation time, a designer might like to program the simulator to re-simulate module M3 only during a limited interval of N nanoseconds of simulation time immediately preceding the time K in which the error in one of its output signals appeared, but the designer cannot do so without specifying the states of the module's internally stored data at time K-N. However since the data representing input and output signals of module M3 do not reflect the state of all its stored data, the designer cannot derive the information needed to properly initialize the state of module M3 at time K-N. The designer must therefore program the simulator to re-simulate module M3 from simulation time 0, where initial states of the module's stored data are known, rather than from time K-N.

What is needed is a way to reduce simulator processing time by requiring a simulator to save simulation data for only a selected portion of a simulated circuit's signals, but which provides enough information about signal states during the simulation to permit re-simulation of any selected subcircuit spanning any selected portion of the full simulation interval.

SUMMARY OF THE INVENTION

In accordance with the invention, a netlist or other description of a circuit is processed to classify some signals of the circuit as essential signals and to classify all other signals of the circuit as non-essential signals. Thereafter when simulating behavior of the entire circuit in response to input signals supplied over some time interval, a simulator saves first simulation data representing behavior of the circuit's essential signals during that time interval. The simulator is then programmed to re-simulate behavior of only a selected subcircuit of the circuit during only a selected subinterval of the full time interval based on behavior of the essential signals described by the first simulation data.

During the re-simulation, the simulator may save second simulation data representing behavior of both essential and non-essential signals of the subcircuit to provide a more complete record of the behavior of the selected subcircuit during the selected subinterval.

Before the initial full-circuit simulation, each signal is classified as an essential signal when its behavior during the full-circuit simulation must be represented by the first simulation data in order to provide sufficient information to program the simulator to re-simulate the behavior any selected subcircuit during any selected subinterval. All other circuit signals are classified as non-essential signals whose behavior need not be represented by the saved first simulation data.

It is accordingly an object of the invention to reduce full-circuit simulation processing time by limiting the number of signals for which the simulator must save data representing signal behavior to the set of "essential signals" for which the saved simulation data provides sufficient information to program a simulator to re-simulate the behavior any selected subcircuit during any selected subinterval It is another object of the invention to further reduce re-simulation processing time by programming a simulator to re-simulate only a selected subcircuit of the circuit.

It is a further object of the invention to further reduce re-simulation processing time by programming a simulator to re-simulate a circuit or a subcircuit thereof during only a selected sub-interval of the full simulation interval.

The claims appended to this specification particularly point out and distinctly claim the subject matter of the invention. However those skilled in the art will best understand both the organization and method of operation of what the applicant(s) consider to be the best mode(s) of practicing the invention by reading the remaining portions of the specification in view of the accompanying drawing(s) wherein like reference characters refer to like elements.

DETAILED DESCRIPTION OF THE INVENTION

As defined in the claims appended to this specification, the invention relates to a method for simulating the behavior of a circuit during a selected time interval and then re-simulating the behavior of a selected subcircuit of that circuit during a selected subinterval of the original simulation interval. While the claims read on all modes of practicing the invention, this section of the specification describes only one particular mode of practicing the invention. Although the description below includes numerous details to provide a thorough understanding of that particular mode, one of skill in the art will understand that such details are not essential to practicing each mode of practicing the invention recited in the claims.

Digital Circuit Architecture

Figure 4:
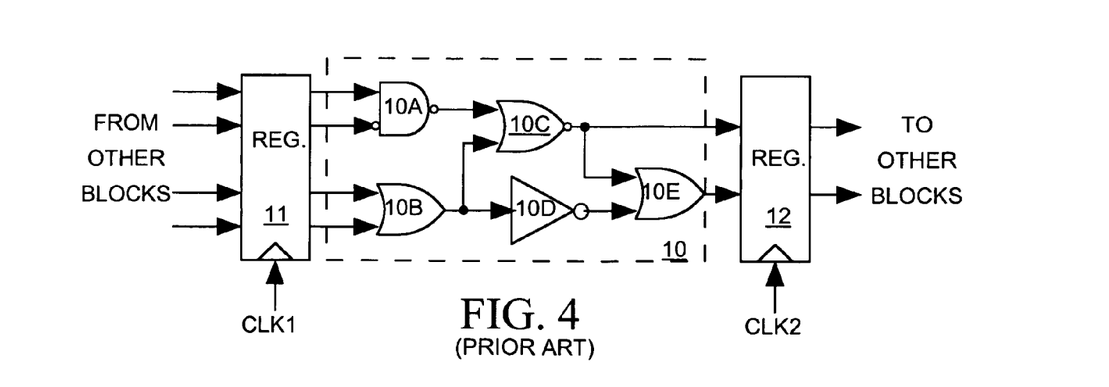
FIG. 4 is a block diagram of a portion of a synchronous logic circuit.

A netlist or other type of circuit description typically describes a digital integrated circuit as including modules that communicate with one another through signals passing though "sequential elements", such as registers, latches, flip-flops and the like, that synchronize state changes in those signals to clock signal edges. For example, FIG. 4 shows a logic block 10 formed by a set of logic gates 10A-10E receiving input signals from other logic modules via a sequential element 11 clocked by clock signal CLK1 and transmitting output signals to other logic modules via another sequential element 12 clocked by clock signal CLK2. Some modules of a circuit may include registers, latches, flip-flops, and random access memories (RAMs) and read only memories (ROMs) employed as data storage devices for storing data and for generating output signals representing their stored data.

Figure 5:
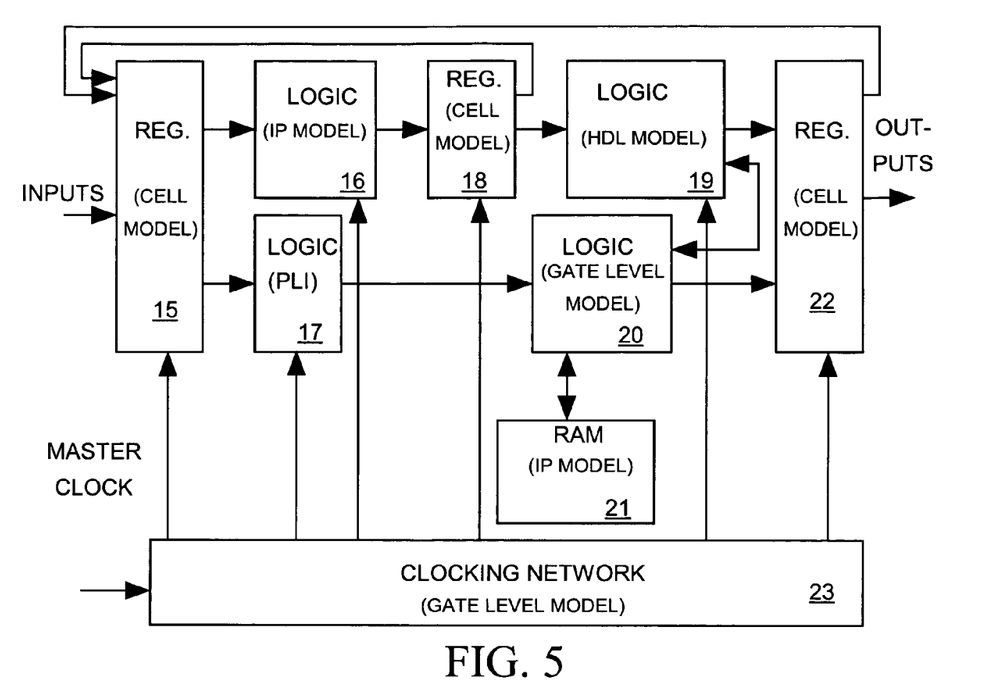
FIG. 5 is a block diagram illustrating a simulated circuit.

A netlist typically describes a circuit as including a hierarchy of modules, with various circuit devices forming low level modules, and interconnected groups of lower level modules forming higher level modules. FIG. 5 illustrates a circuit at one level of its design hierarchy as consisting of a set of modules, including sequential elements 15, 18 and 22, logic modules 16, 17, 19 and 20, a RAM 21 and a clocking network 23 for supplying clock signals derived from a master clock signal to the other modules. Normally, the designer uses a high level language to specify the behavior of each module and then uses various computer-aided design tools to convert the high level behavioral models of the modules into progressively more detailed models of the modules. When the design of a module progresses to the "gate" level, it describes the module as being formed by instances of standard cells, such as transistors, gates, passive devices and other components that communicate through signals. At the layout level of the design, the position of each cell within an IC layout and the routing of conductors forming the nets are established.

Simulation

At each step of the design process, the designer can program a computer-based circuit simulator to test the circuit design by supplying the simulator with an input "testbench" providing behavioral models of circuit components, indicating how components are interconnected, describing the behavior of the circuit's input signals over some interval of time, and indicating initial states of any stored data at the start of the simulation. The simulator then generates data indicating how various signals produced by the circuit would respond to those circuit input signals during the time interval the simulation spans. The designer can then analyze that data to determine whether a circuit based on the design would behave as expected.

At any stage of the design process, the netlist may use different approaches for modeling various modules. For example, some of the components at the hierarchical design level depicted in FIG. 5 may be individual cells such as sequential elements 15, 18 and 22 described by cell models available in a cell library. Other modules, such as modules 19 and 20, may be custom designed logic modules represented, for example by an HDL model or a gate level model. When a previously designed and tested "intellectual property" (IP) module, such as module 16 or 21, is incorporated into the design, the simulator may employ an "IP model" that models its behavior only with respect to its input and output terminals. In some cases, the behavior of IP module is simulated by third-party software rather than by the simulator, and in such case, the simulator need implement only a programming language interface (PLI), such as for module 17, for communicating with the third party software during the simulation.

A simulator simulates a circuit's behavior over an interval for which the testbench describes the behavior of the circuit's input signals. A testbench can configure the simulator to save simulation data indicating when signals change state, and the states to which they change, to provide a record of signal behavior to help the designer determine whether the design is flawed, and if so, to determine the nature of any design errors. When simulating the behavior of a large circuit over a long interval, a simulator will normally not be able to retain all of the generated simulation data in memory, so it will temporarily suspend the simulation process when its memory resources are filled and write the accumulated simulation data to a hard disk. Such simulation data "dumps" can substantially increase simulator processing time.

Incremental Re-Simulation

In accordance with the invention, the processing time a simulator needs to simulate a circuit is decreased by initially programming it to save simulation data describing behavior of only a selected set of "essential signals" rather than all signals of the circuit. The essential signals are selected such that when the state of each essential signal at all times during the simulation is known, a simulator could determine the state of every other signal of the circuit at any given time from the states of the essential signals. After the simulator carries out the simulation for the entire circuit, and has saved the simulation data, a user can request a testbench generator to generate a testbench for programming a simulator to re-simulate only a selected subcircuit of the circuit during one or more selected subinterval of the original simulation time, with the simulator saving simulation data describing behavior for all the input, internal and external signals of the subcircuit.

For example, the essential signals of the circuit model of FIG. 5 include the circuit's primary input signals (INPUTS), the output signals of IP modules 16 and 21, of PLI interface 17, and of all data storage devices and sequential elements within the remaining portions of the circuit, and any internal signal of a high level language module such as HDL model 19 that represents stored data.

Assume, for example, that a simulator is programmed to simulate a circuit that includes the subcircuit of FIG. 4 and other subcircuits and to save simulation data only for the essential signals. For the subcircuit of FIG. 4, only the output signals of sequential elements 11 and 12 are essential signals because they represent data that the sequential elements store between clock signal edges. None of the output signals of any of gates 10A-10E are essential signals. At the end of the initial simulation, a user can directly determine the state of data stored in sequential elements 11 and 12 at any simulation time from the saved simulation data, though the user cannot directly determine the state of the output signals of any of gates 10A-10E from that simulation data. Suppose a user detects an error in the output of sequential element 12 at simulation time K and suspects that the error may have resulted from an error in the output of one of gates 10A-10E occurring within N nanoseconds prior to time K. The user might like to program the simulator to re-simulate only the behavior of gates 10A-10E and sequential element 12 during a subinterval or the initial simulation interval starting at time K-N and ending at time K, with the simulator saving simulation data describing behavior of all output signals of gates 10 and sequential element 12. Such information would give the user a better picture of the internal behavior of a module formed by logic gates 10 so that the user could more easily detect any logic or timing problems in that logic module.

Since the behavior of the output signals of sequential element 11 at any simulation time can be determined from the simulation data saved during the initial whole circuit simulation, it is possible to create a testbench for controlling the re-simulation that defines the behavior of the input signals to the logic gates 10 throughout the entire re-simulation interval of interest from time K-N to time K. This renders it unnecessary to re-simulate any portion of the circuit supplying signals to sequential element 11 or to re-simulate any other portion of the circuit that receives output signals from sequential element 12, even though such other portions of the circuit may supply input signals to sequential element 11. However, to begin the re-simulation of gates 10 and sequential element 12 at simulation time K-N, it would be necessary for the testbench to set the output signals of gates 10A-10E to the states that had immediately prior to time K-N. Since the simulator did not save simulation data for those signals during the simulation, the information needed to determine the state of such non-essential signal is not directly available in the simulation data produced during the initial whole circuit simulation. However the simulator itself can recover that information during the re-simulation if it is programmed to begin the re-simulation an appropriate number C of nanoseconds before time K-N.

Suppose any change in any output signal of sequential element 11 requires no more than C of nanoseconds to propagate through gates 10A-10E and sequential element 12 to affect a change in the output signals of sequential element 12. Then if the simulator is programmed to simulate gates 10A-10E and sequential element 12 starting at simulation time K-N-C, the states of the signals at the outputs of gates 10A-10E will be correct from time K-N through time K even if their states are incorrectly initialized for at time K-N-C. Thus, rather than programming the simulator to re-simulate gates 10 and sequential element 12 starting at the time K-N of interest, it is programmed it to begin the re-simulation at time K-N-C to provide sufficient lead time for the non-essential signals to settle to their proper states. Thus while the re-simulation spans a selected subinterval K-N-C through K, the re-simulation generates data describing signal behavior that is accurate only for the subinterval spanning times K-N through K.

Since the simulator saves the simulation data describing behavior only for a simulated circuit's "essential signals" rather than for all circuit signals during the initial simulation, it avoids having to write simulation data to a hard disk very often during the simulation process, thereby speeding up the simulation process. Making use of the saved essential signal simulation data, the system can thereafter re-simulate any selected subcircuit of that circuit over any selected subinterval of the original simulation interval without having to re-simulate any other portion of the circuit, provided that the re-simulation subinterval begins a sufficient amount of time C before the time N that simulation data accurately describing signal behavior is needed.

Simulation/Re-Simulation Process Flow

Figure 6:
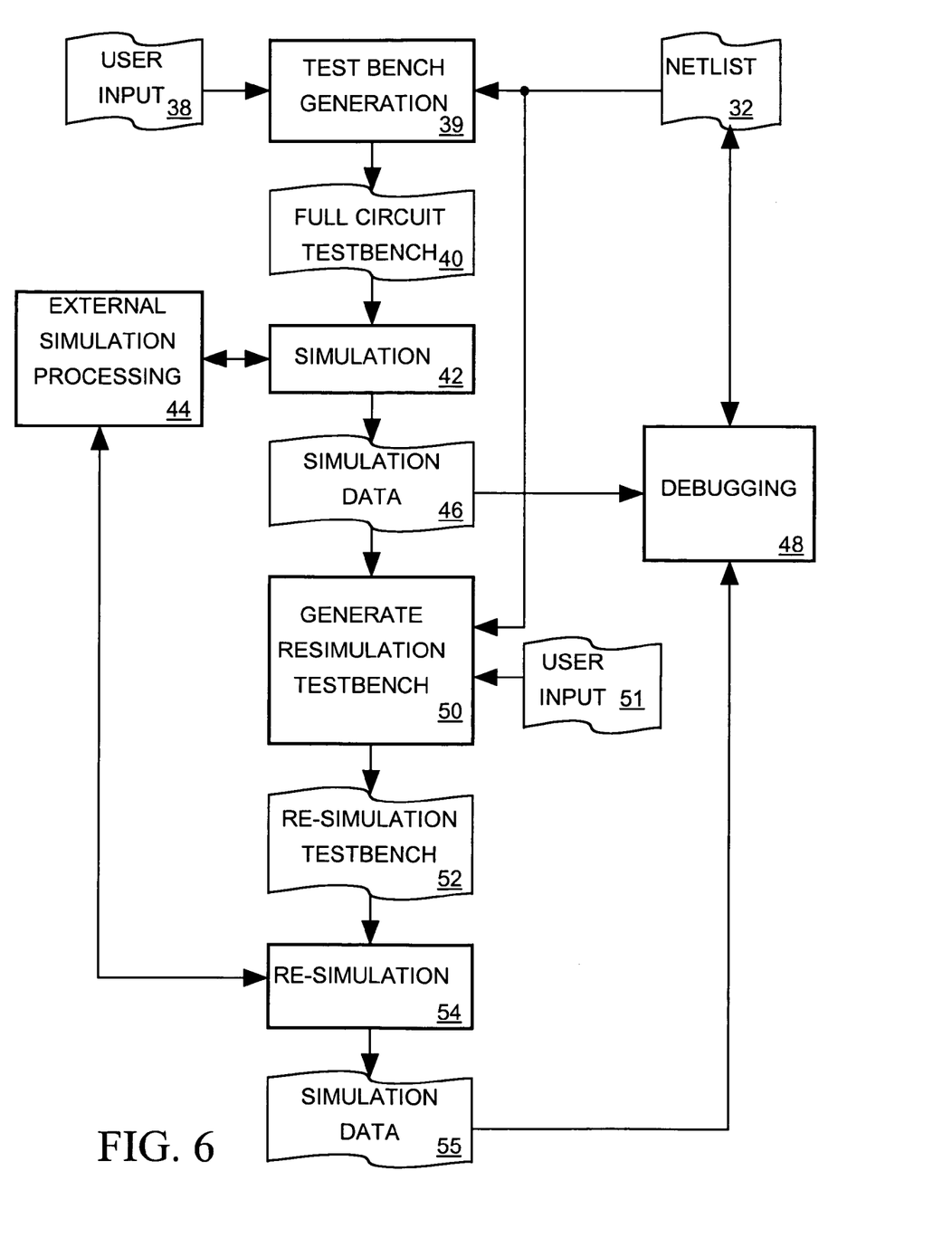
FIG. 6 is a data flow diagram of a circuit simulation system in accordance with the invention.

FIG. 6 is a dataflow diagram for a computer-based circuit simulation and re-simulation process in accordance with the invention. In an initial step 39 a user directs a computer to generate a testbench 40 describing the entire circuit to be simulated based on a netlist description 32 of the circuit provided by a user. Based on information provided by user input 38, testbench 40 also indicates the initial states of circuit signals and describes the time varying behavior of the circuit's primary input signals. Testbench 40 then directs a circuit simulator to simulate the response of the circuit described by netlist 32 in response to the primary input signals (step 42) and to save simulation data 46 describing behavior of selected signals during the simulation. In generating testbench 40 at step 30, the computer processes netlist 32 and user input 38 to identify the following as essential signals.

1. The output signals of portions of the circuit simulated or emulated by any software or hardware external to the simulator with which the simulator communicates via a programming language interface, 2. All primary input signals received by portions of the circuit directly simulated by the simulator, 3. The data output signals of all sequential elements directly simulated by the simulator, and 4. The data output signals of all devices directly simulated by the simulator that store data and generate output signals representing the stored data including random access memories, read only memories, registers, flip-flops, latches and the like.

All other signals are classified as non-essential. Unless user input 38 directs otherwise, simulation data 46 will include data describing the behavior only of the identified essential signals, however, user input 38 may direct the computer at step 39 to configure testbench 40 so that simulation data 46 also describes behavior of user-selected non-essential signals that may be of particular interest, such as circuit output signals that may not be otherwise automatically identified as essential.

To help limit simulation time, user input 38 may direct the computer to configure testbench 40 to indicate the simulator is to refrain from saving data representing behavior of certain user-selected essential signals when the user is sure that those signals are internal to modules the user knows will never be included in the subcircuit to be re-simulated. For example some of the modules of the circuit may be "pre-tested modules" that have been separately simulated and proven to behave properly and therefore need never be included as a part of the subcircuit to be re-simulated. When user input 38 indicates that a module of the circuit netlist 32 describes is a pre-tested module, testbench 40 will direct the simulator to save data describing only the behavior of the output signals of the pre-tested module and to refrain from saving data describing the behavior of any of the modules internal signals.

During the simulation process (step 42) the simulator, in conjunction with any necessary external simulation or emulation resources 44 accessed via a programming language interface, simulates the circuit and save simulation data 46 to a hard disk or similar bulk storage device. Thereafter during debugging step 48, the user can employ conventional debugging software to analyze the simulation data 46 to determine whether an error appears in any essential signal at any simulation time. The simulator may also internally detect and report an error. Upon detecting an error in a signal at some simulation time K, user input 51 may command a testbench generator to generate a testbench (step 50) for programming a simulator to re-simulate all or a part of the circuit at step 54. User input 51 may select any one of the following three re-simulation options.

1. Full Circuit, Subinterval Re-simulation. User input 51 may indicate the entire circuit is the subcircuit to be re-simulated during one or more user-selected subintervals, wherein each subinterval spans times K-N through K of the initial full-circuit simulation. In such case user input 51 indicates the values of K and N for each subinterval of interest.

2. Subcircuit, Subinterval Re-simulation. User input 52 may indicate that only a user-selected portion of the circuit is the subcircuit to be re-simulated during one or more user-selected subintervals, wherein each subinterval spans times K-N through K of the initial full-circuit simulation. In such case user input 51 indicates which subcircuit of the circuit is to be simulated and provides the values of K and N for each subinterval of interest.

3. Fan-in, Subinterval Re-simulation. User input 52 may indicate that only the portion of the circuit that is capable of influencing the state of a selected signal at time K during the selected time interval K-N through K. In such case user input 51 need only identify the signal of interest and the values of K and N; the computer automatically determines at step 50 the particular subcircuit of the circuit to be re-simulated.

In carrying out each of the above three command options at step 50, the computer configures re-simulation testbench 52 to indicate that during the re-simulation process (step 54) the simulator is to save simulation data 55 describing behavior during the subinterval(s) of interest of all input, internal and output signals of the subcircuit being re-simulated, except for data describing behavior of any signals user input 51 indicates need not be saved. Testbench 52 indicates that re-simulation for each subinterval of interest is to begin a predetermined number C of nanoseconds before time N-K to allow non-essential signals of the re-simulated subcircuit to settle to their proper states by time K-N.

The re-simulation testbench restarts the re-simulation at time N-K-C by forcing essential signals to the values at time N-K-C and thereafter indicated by the simulation data output of the initial simulation and using them to drive the portion of the circuit being re-simulated.

Re-Simulation After Circuit Modification

After the re-simulation at step 54, the user may revisit debugging step 48 to analyze simulation data 46 and 55 and may be able to determine sources of any observed signal errors and modify the circuit design to correct those errors, thereby altering the netlist description 32 of the circuit, for example to altering path delays of signals within the circuit or to modify circuit logic. At that point the user may chose to restart the entire simulation process at step 39, but if the circuit modification affects only a limited portion of the circuit, the user can save much simulation processing time by instead choosing to re-simulate only the modified portion of the circuit design by restarting the process at step 50 and selecting option 2 above. In such case the user may, for example, choose to set K and N so the selected interval K-N-C through K spans the entire original full-circuit simulation time.

Re-Simulation with Signal Forcing

During the debugging process at step 48, the user may decide that it would be helpful to re-simulate a selected subcircuit when one or more of essential signals acting as inputs to the subcircuit exhibit behavior that differs from the behavior described by the simulation data 46 output of the full-chip simulation carried out at step 42. In such case, when user input 51 indicates that particular portion of the circuit is to be re-simulated during some interval of interest, user input 51 includes a forcing specification of the behavior of those selected input signals. Thereafter, at step 50, the re-simulation testbench generator employs the user-provided forcing specification for those particular signals rather than the description of those signals included in simulation data 46 when compiling testbench 52. Also one or more of the signals with changed/forced values need not be essential signals.

Fan-In Detection

Figure 7:
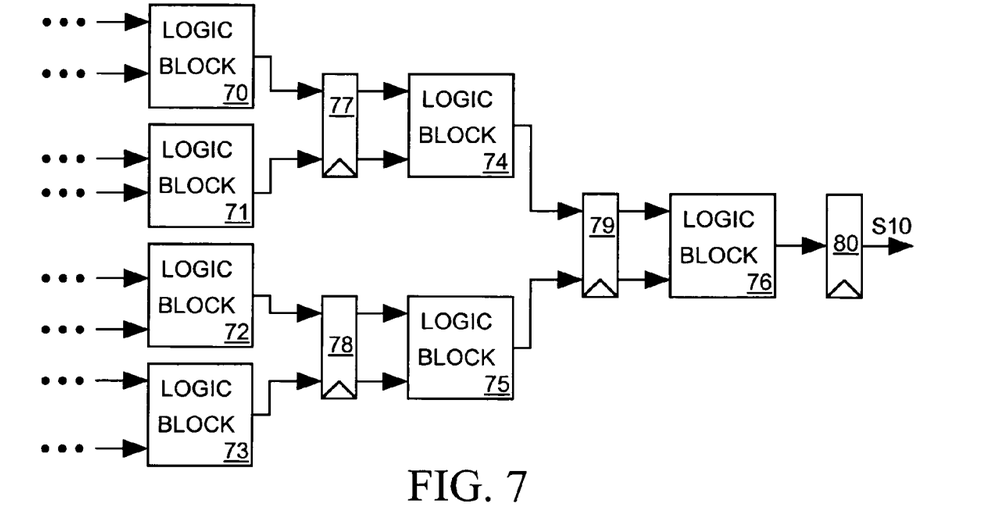
FIG. 7 is a block diagram illustrating portions of a circuit residing in the fan-in cone of a signal.

In carrying out command option 3 above at step 50 of FIG. 6, the computer automatically identifies the portions of the circuit that could have affected the state of a user-selected signal at some user-selected time K during the subinterval spanning times K-N through K. FIG. 7 depicts a portion of a circuit including a set of logic modules 70-76 that communicate through sequential elements 77-80. In this example all of the internal signals of logic modules 70-76 are non-essential, and during an initial simulation, the simulator saves simulation data only for the essential signal outputs of sequential elements 77-80. Based on the saved simulation data, a user might detect an error in the output signal S10 of sequential element 80 at some simulation time K and request a re-simulation only of the part circuit carrying out logic within N nanoseconds of time K that could have affected the state of signal S10 at time K. In such case the computer, at step 50, processes the netlist to automatically determine which portions of the circuit are to be re-simulated.

If N is relatively small so that the total time span between time K-N and time K is less than the phase difference between the clock signals clocking sequential elements 79 and 80, then only operations of logic module 76 at times K-N through K can influence the state of signal S1 at simulation time K. Thus it would be necessary for the testbench generator to program the simulator to re-simulate logic module 76 and sequential element 80. When N is sufficiently large that logic carried out by modules 74-76 at any time following time K-N could affect the states of signal S10 at time K, then the simulator must re-simulate behavior of logic modules 74-76 and sequential elements 79 and 80. When N is sufficiently large that logic carried out by modules 70-76 at any time following time K-N could affect the states of signal S10 at time K, then the simulator must re-simulate logic modules 70-76 and sequential elements 77-80. In any case, the selected re-simulation subinterval must begin at some earlier time K-N-C to allow a sufficient number of nanoseconds C of simulation time for the internal signals of logic module 76 to settle to their initial states as of time K-N.

We define the "N-nanosecond fan-in cone" of signal S10 as the set of all circuit components carrying out logic that can influence the state of signal S10 within N nanoseconds. Thus in carrying out command option 3 above, the testbench generator automatically identifies the N-nanosecond fan-in cone of the signal of interest, and configures the testbench to re-simulate that fan-in cone's behavior during the selected subinterval N-K-C through time K. At step 50 the testbench generator can, for example, traverse signal paths through the circuit netlist starting at sequential element 80 to identify each sequential element in the fan-in cone signal S10 for which the total clocking delay between that sequential element and the output of sequential element 80 is less than the period between times K-N and K. The computer therefore includes the identified sequential elements and all logic modules supplying input signals to the identified sequential elements and to sequential element 80 in the N nanosecond fan-in cone of the selected signal S10.

Figure 8:
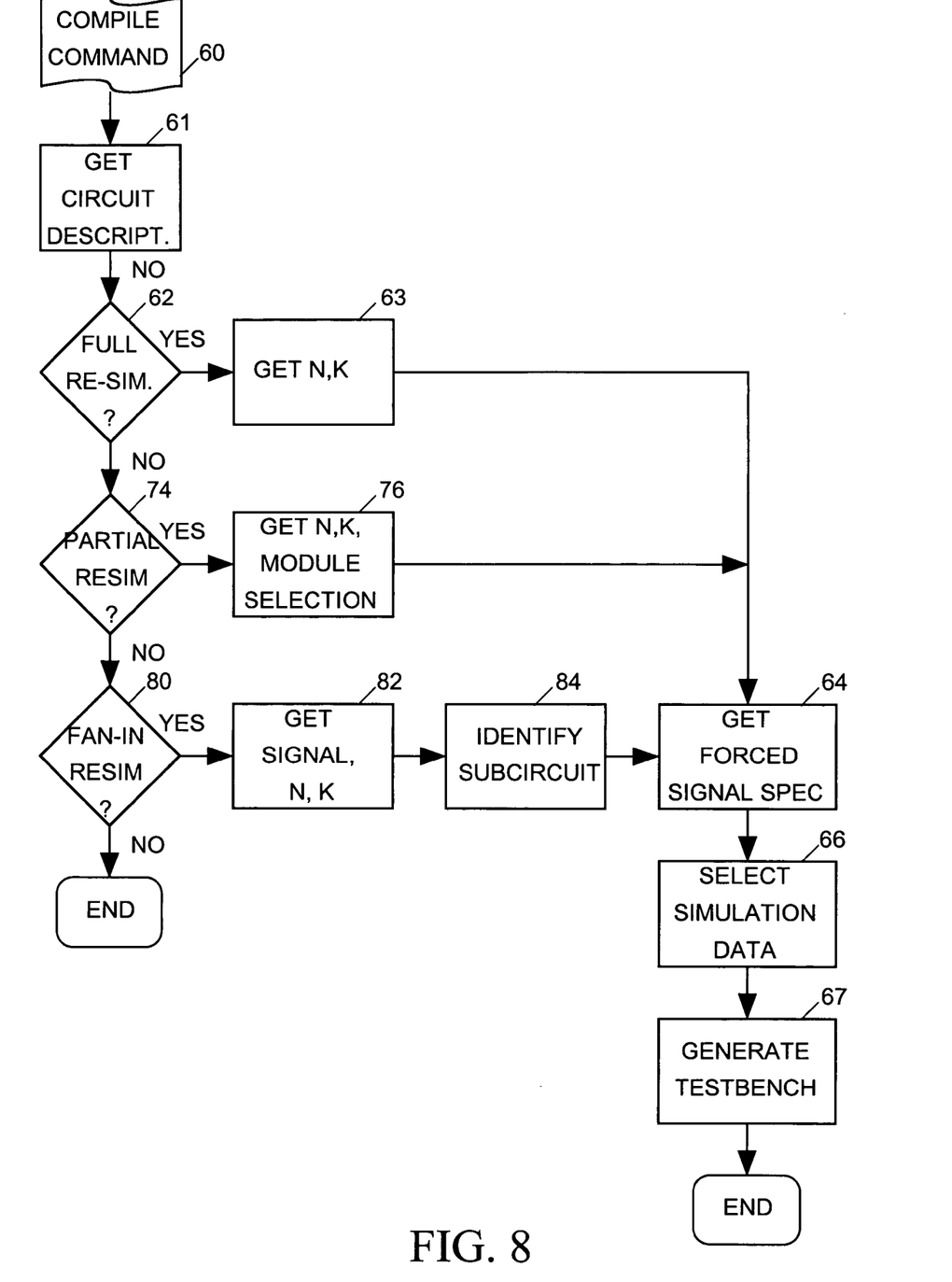
FIG. 8 is a flow chart illustrating behavior of the testbench generator of FIG. 6.

FIG. 8 is a flow chart for a testbench generator that can implement step 50 of FIG. 6. Upon receiving user input 51 (FIG. 6) containing a command 60 to generate a testbench, the testbench generator obtains the netlist description of the circuit from the user (step 61). When the input command 60 indicates the testbench generator is to generate a testbench for a full re-simulation of the circuit over one or more limited subintervals of the full simulation period (step 62), the testbench generator obtains separate values of N and K for each subinterval from the user (step 63). The testbench generator acquires a behavioral specification for each signal of the portion of the circuit to be re-simulated that is to be forced to behave in a particular manner between simulation times K-N-C and K for each subinterval (step 64). Normally the testbench generator will obtain the behavioral data for such "forced signals" from the essential signal data included in the simulation data 46 produced during the initial full-circuit simulation step 42 (FIG. 6). However, as mentioned above, the user may provide an alternative behavioral specification for one or more of those signals. Either the user or the testbench generator selects the value of C to provide sufficient lead time prior to time K-N to allow the state of the simulated circuit to settle to their proper states by the start (time K-N) of each selected subinterval. After obtaining the signal forcing specification (step 64) the testbench generator processes the user-supplied netlist description of the circuit to identify the signals for which the simulator is to save simulation data (step 66). Normally the testbench generator will configure the testbench to indicate the simulator is to save simulation data for all circuit signals fully describing their behavior during the subinterval(s) of interest, though to reduce re-simulation time, the user may specify that the simulator is to refrain from saving simulation data for selected signals. Thereafter, the testbench generator generates a testbench for the full circuit re-simulation (step 67).

After receiving an input command to generate a testbench for a re-simulation of a user-selected subcircuit over one or more subintervals of the simulation time (step 74), the user supplies the values of N and K for each subinterval and to select the module(s) to be re-simulated (step 76). The testbench generator also (step 64) acquires a behavioral specification for each signal of the portion of the circuit to be re-simulated that is to be forced to behave in a particular manner between simulation times K-N-C and K defining each selected subinterval either from the essential signal data included in the simulation data 46 (FIG. 6) or from an alternative user-provided signal forcing specification. The testbench generator then executes previously described steps 66 and 67 to identify the signals for which the simulator is to save simulation data and then generate a testbench for the re-simulation.

After receiving an input command to generate a testbench for a re-simulation of the fan-in cone for a signal of interest between a user-selected interval spanning times K-N through N (step 80), the user identifies the signal of interest and supplies the values of N and K (step 82). The testbench generator then executes previously described steps 64, 66 and 67 to get the necessary forced signal specifications, to identify the signals for which the simulator is to save simulation data and to thereafter generate a testbench for the re-simulation.

Thus has been shown and described one particular mode of practicing a method for simulating a circuit in accordance with the invention as defined in the claims appended to this specification. Although the description above includes numerous details to provide a thorough understanding of that particular mode, many such details are not essential to practicing the invention as recited in the claims.

The invention claimed is:

1. A method for predicting behavior of a circuit for receiving and processing primary input signals, the circuit comprising at least one data storage device and modules communicating through sequential elements, wherein at least one of the modules comprises logic gates, the method comprising the steps of:
   a. processing a circuit description to classify some signals of the circuit as essential signals and to classify all other signals of the circuit as nonessential signals,
      wherein essential signals comprise the primary input signals, output signals of the sequential elements, and output signals of the at least one data storage device,
      wherein nonessential signals comprise output signals of the logic gates,
   b. based on information included in the circuit description and a specification of behavior during a time interval of all primary input signals to the circuit performing a full-circuit simulation of circuit behavior during the time interval, including generating and saving first simulation data representing behavior of the essential signals during the time interval,
   c. selecting a subinterval of the time interval,
   d. selecting a subcircuit of the circuit comprising at least one of the modules, and
   e. based on information included in the first simulation data and the circuit description, re-simulating behavior only of the selected subcircuit during the selected subinterval, including generating and saving second simulation data representing behavior of at least one of the essential and non-essential signals of the selected subcircuit during the selected subinterval.

2. The method in accordance with claim 1
wherein every signal of the circuit that is other than one of the sequential element output signals, one of the primary input signals, or one of the data storage device output signals is classified as a non-essential signal at step a.

3. The method in accordance with claim 1 wherein step d comprises the substeps of
   d1. selecting one of the circuit essential signals, and
   d2. processing the circuit description to identify the selected subcircuit as comprising portions of the circuit that can influence a state of the essential signal selected at step d1 during the selected subinterval.

4. The method in accordance with claim 1 wherein the first simulation data represents behavior of all essential signals and refrains from representing behavior of any nonessential signals.

5. The method in accordance with claim 1 further comprising the step of selecting at least one nonessential signal,
   wherein the first simulation data saved at step b also represents behavior of the selected at least one non-essential signal and refrains from representing behavior of any other nonessential signal.

6. The method in accordance with claim 1 further comprising the step of selecting at least one essential signal,
   wherein the first simulation data saved at step b represents behavior of all essential signals other than the selected at least one essential signal.

7. The method in accordance with claim 1 wherein the second simulation data represents behavior of all essential and nonessential signals of the selected subcircuit during the selected subinterval.

8. The method in accordance with claim 7
   wherein at step b a circuit simulator generates and saves the first simulation data,
   wherein the circuit simulator includes a programming language interface to obtain data from an external source representing behavior of output signals of at least one module of the circuit, and
   wherein all output signals of said at least one module are classified as essential signals and all internal signals of said at least one module are classified as nonessential signals at step a.

9. The method in accordance with claim 1 further comprising the step of, prior to step e, selecting signals of the selected subcircuit, wherein the second simulation data represents behavior only of the selected signals of the selected subcircuit during the selected subinterval.

10. The method in accordance with claim 1 further comprising the step of selecting signals of the selected subcircuit, wherein the second simulation data represents behavior of all essential and non essential signals of the selected subcircuit during the selected subinterval other than the selected signals of the selected subcircuit.

11. The method in accordance with claim 1 comprising the step of designating at least one of the modules of the circuit as a pre-tested module, wherein all output signals of each designated pre-tested module are classified as essential signals and all internal signals of each designated pre-tested module are classified as nonessential signals at step a.

12. The method in accordance with claim 1 further comprising the step of receiving forcing data representing a desired behavior during the selected subinterval of at least one signal of the selected subcircuit, wherein the desired behavior of the at least one signal represented by the forcing data during the selected subinterval differs from the behavior described by the first simulation data, and wherein when re-simulating the behavior of the selected subcircuit at step e, the at least one signal is treated as behaving in a manner described by the signal forcing data, and all other essential signals of the selected subcircuit are treated as behaving in a manner described by the first simulation data.

13. The method in accordance with claim 1 further comprising the step of, prior to step e, modifying the circuit description to modify the selected subcircuit to modify a path delay of at least one signal of the subcircuit.

14. The method in accordance with claim 1 further comprising the step of, prior to step e, modifying the circuit description to modify logic carried out by the selected subcircuit.

* * * * *